US011758667B2

(12) United States Patent
Saito et al.

(10) Patent No.: US 11,758,667 B2
(45) Date of Patent: Sep. 12, 2023

(54) ELECTRONIC CONTROL UNIT

(71) Applicant: Hitachi Astemo, Ltd., Hitachinaka (JP)

(72) Inventors: Masato Saito, Hitachinaka (JP); Michihito Watarai, Hitachinaka (JP)

(73) Assignee: Hitachi Astemo, Ltd., Hitachinaka (JP)

(*) Notice: Subject to any disclaimer, the term of this patent is extended or adjusted under 35 U.S.C. 154(b) by 88 days.

(21) Appl. No.: 17/595,667

(22) PCT Filed: May 15, 2020

(86) PCT No.: PCT/JP2020/019401
§ 371 (c)(1),
(2) Date: Nov. 22, 2021

(87) PCT Pub. No.: WO2020/235464
PCT Pub. Date: Nov. 26, 2020

(65) Prior Publication Data
US 2022/0225516 A1 Jul. 14, 2022

(30) Foreign Application Priority Data
May 23, 2019 (JP) ................................ 2019-096704

(51) Int. Cl.
H05K 5/00 (2006.01)
B60R 16/023 (2006.01)
H05K 5/03 (2006.01)

(52) U.S. Cl.
CPC ....... *H05K 5/0056* (2013.01); *B60R 16/0238* (2013.01); *B60R 16/0239* (2013.01); *H05K 5/0017* (2013.01); *H05K 5/03* (2013.01)

(58) Field of Classification Search
USPC .................................. 361/728, 752, 816, 818
See application file for complete search history.

(56) References Cited

U.S. PATENT DOCUMENTS 9,848,501 B2 * 12/2017 Takamatsu ........... H01R 12/722
2005/0020141 A1 1/2005 Mizutani
(Continued)

FOREIGN PATENT DOCUMENTS

| CN | 1413077 A | 4/2003 |
| CN | 101127422 A | 2/2008 |

(Continued)

OTHER PUBLICATIONS

International Search Report (PCT/ISA/210) issued in PCT Application No. PCT/JP2020/019401 dated Sep. 1, 2020 with English translation (five (5) pages).
(Continued)

Primary Examiner — Hung S. Bui
(74) Attorney, Agent, or Firm — Crowell & Moring LLP

(57) ABSTRACT

An electronic control unit (1) includes a connector (2), the connector includes a connector main body (21) and a plurality of terminals (23), the connector main body includes an attachment surface (24) and a seal arrangement portion (210) on a surface (25), the seal arrangement portion includes a first seal arrangement portion (211) formed in an arrangement direction of the terminals, and a second seal arrangement portion (212) that is continuous with both end portions (213) of the first seal arrangement portion and is inclined toward the electronic control board side as it goes toward the other end side facing one end side of an electronic control board (6), the first seal arrangement portion includes a plurality of predetermined portions (2112) formed so as to be directed toward the electronic control board side from a center side of the first seal arrangement portion toward both end sides of the first seal arrangement portion at both end portions of the first seal arrangement portion, the cover (3) includes a plurality of bent portions (312) formed so as to be directed toward the electronic control board side (Continued)

from a center side of the cover toward both end sides of the cover, and each of the predetermined portions is in contact with each of the bent portions.

12 Claims, 9 Drawing Sheets

(56) References Cited

U.S. PATENT DOCUMENTS

| | | |
|---|---|---|
| 2008/0045061 A1 | 2/2008 | Hayashi |
| 2009/0068862 A1 | 3/2009 | Honda |
| 2009/0237896 A1 | 9/2009 | Yamauchi |
| 2014/0065877 A1 | 3/2014 | Ohhashi |
| 2014/0307399 A1* | 10/2014 | Tamura ............... H05K 5/0039 361/752 |
| 2015/0250072 A1 | 9/2015 | Ichikawa |
| 2016/0113137 A1* | 4/2016 | Nuriya ............... H05K 7/20445 361/728 |
| 2018/0109027 A1 | 4/2018 | Kaneko et al. |

FOREIGN PATENT DOCUMENTS

| | | |
|---|---|---|
| CN | 103687393 A | 3/2014 |
| CN | 104883849 A | 9/2015 |
| CN | 107710893 A | 2/2018 |
| JP | 2004-319169 A | 11/2004 |
| JP | 2009-70855 A | 4/2009 |
| JP | 2009-230925 A | 10/2009 |
| JP | 2017-4698 A | 1/2017 |
| WO | WO 2016/203600 A1 | 12/2016 |

OTHER PUBLICATIONS

Japanese-language Written Opinion (PCT/ISA/237) issued in PCT Application No. PCT/JP2020/019401 dated Sep. 1, 2020 (three (3) pages).

Chinese-language Office Action issued in Chinese Application No. 202080028802.7 dated Sep. 30, 2022 with English translation (12 pages).

* cited by examiner

ELECTRONIC CONTROL UNIT

TECHNICAL FIELD

The present invention relates to an electronic control unit.

BACKGROUND ART

In the related art, an electronic control unit that controls a vehicle is known. The electronic control unit includes an electronic control board inside a housing. The electronic control unit secures waterproofness by providing a seal member in the housing. However, the housing is deformed due to a difference between an air pressure inside the housing and an air pressure outside the housing. The difference between the air pressure inside the housing and the air pressure outside the housing is caused by a temperature difference between air inside the housing and air outside the housing. The temperature difference between the air inside the housing and the air outside the housing is caused by self-heating or submersion of the vehicle. Since deformation of the housing imposes a load on the seal member, the seal member is separated from the housing. As a result, the electronic control unit is weakened in waterproofness. The electronic control unit is required to have a structure that suppresses a load on the seal member in order to ensure waterproofness.

A technique of PTL 1 includes a parallel seal portion substantially parallel to a surface of a board, an outer peripheral seal portion, and an inclined seal portion connecting the parallel seal portion and the outer peripheral seal portion. In the inclined seal portion, a connection end with the outer peripheral seal portion is closer to a back side of an internal space than a connection end with the parallel portion in a lateral direction. As a result, the electronic device can reduce a size in a longitudinal direction of the housing while suppressing tearing of a sealing material.

A technique of PTL 2 includes a substantially trapezoidal connector, a case configured such that the connector is fitted into a recess, and a sealing material that seals between the connector and the case. A case slope inclination angle formed by a side facing a short side of the case and an inclined surface is larger than a connector slope inclination angle formed by a short side and the inclined surface of the connector. Since the connector slope inclination angle is smaller than the case slope inclination angle, it is possible to reduce an amount of pressing of the sealing material. As a result, a filling amount of the sealing material can be sufficiently secured even on a long side of the connector.

CITATION LIST

Patent Literature

PTL 1: JP 2009-230925 A
PTL 2: JP 2004-319169 A

SUMMARY OF INVENTION

Technical Problem

In PTL 1, waterproofness is secured by the parallel seal portion, the outer peripheral seal portion, and the inclined seal portion. Since the electronic device includes the inclined seal portion, it is possible to suppress tearing of the sealing material when an upper case and a lower case are assembled to the connector. However, PTL 1 does not describe that the waterproofness is weakened by deformation of the upper case or the lower case.

In PTL 2, the sealing material on the long side of the connector is thicker than the sealing material on the short side of the connector. As a result, the sealing material can alleviate the influence of the stress received from the connector due to thermal expansion of the connector. However, PTL 2 does not describe that the waterproofness is weakened by deformation of the case.

Therefore, the present invention is made to solve the above problems, and provides an electronic control unit capable of improving waterproof reliability.

Solution to Problem

According to an aspect of the present invention, there is provided an electronic control unit including: an electronic control board; a connector provided on one end side of one surface of the electronic control board; a cover provided on the one surface side and covering the electronic control board and the connector; and a base provided on another surface side of the electronic control board so as to face the cover; and a seal member interposed between the connector and the cover, in which the connector includes: a connector main body; a plurality of terminals arranged in a longitudinal direction of the connector main body and provided so as to protrude from the connector main body toward the one end side, the connector main body includes: an attachment surface attached to the electronic control board; a seal arrangement portion which is positioned on a surface on a side facing the attachment surface and on which the seal member is disposed, the seal arrangement portion includes: a first seal arrangement portion formed in an arrangement direction of the terminals; a second seal arrangement portion that is continuous with both end portions of the first seal arrangement portion and is inclined toward the electronic control board as it goes toward another end side facing the one end side of the electronic control board, the first seal arrangement portion includes a plurality of predetermined portions formed so as to be directed toward the electronic control board from a center side of the first seal arrangement portion toward both end sides of the first seal arrangement portion at both end portions of the first seal arrangement portion, the cover includes a plurality of bent portions formed so as to be directed toward the electronic control board from a center side of the cover toward both end sides of the cover, and each of the predetermined portions is in contact with each of the bent portions.

Advantageous Effects of Invention

According to the present invention, waterproof reliability can be improved.

DESCRIPTION OF EMBODIMENTS

Figure 1:
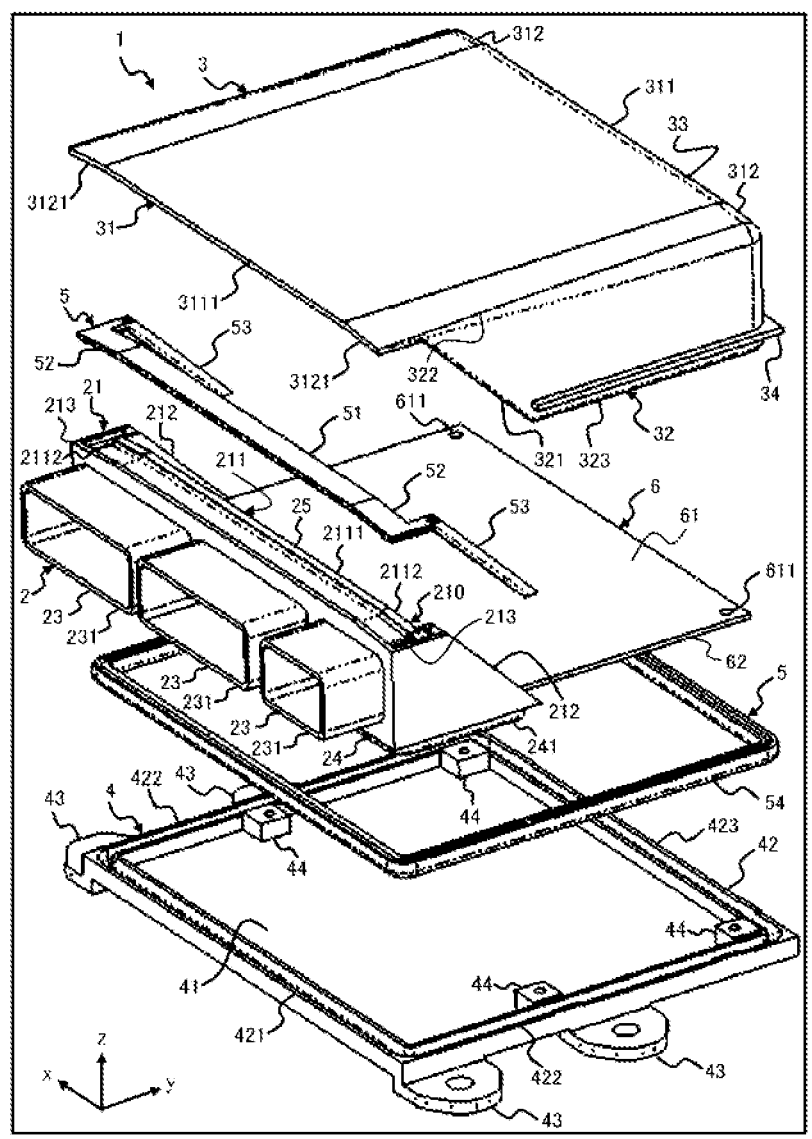
FIG. 1 is an exploded view of an electronic control unit according to a first embodiment.

Hereinafter, an embodiment of the present invention will be described, but the present embodiment is not limited to the embodiment described in each drawing. The present embodiment relates to an electronic control unit 1 capable of improving waterproof reliability.

In the drawing, an x-axis direction indicates, for example, a longitudinal direction of a connector main body 21. A y-axis direction indicates, for example, a direction that passes through one end side of an electronic control board 6 on which a connector 2 is provided and the other end side corresponding to the one end side of the electronic control board 6 and is perpendicular to the x-axis direction. A z-axis direction indicates, for example, a direction perpendicular to a surface of the electronic control board 6.

A direction in which the connector 2 is positioned with respect to the electronic control board 6 on a y axis may be referred to as a front direction. A direction in which the electronic control board 6 is positioned with respect to the connector 2 on the y axis may be referred to as a depth direction. A direction in which a cover 3 is positioned with respect to the electronic control board 6 on a z axis may be referred to as an upward direction. A direction in which the base 4 is positioned with respect to the electronic control board 6 on the z axis may be referred to as a downward direction.

In the following description, an "upper side" refers to a predetermined portion positioned upward from a central portion of a predetermined member. A "lower side" indicates a predetermined portion positioned downward from a central portion of a predetermined member. A "front side" indicates a predetermined portion positioned in a front direction from a central portion of a predetermined member. A "depth side" indicates a predetermined portion positioned in a depth direction from a central portion of a predetermined member.

The electronic control unit 1 controls a vehicle, for example. The electronic control unit 1 includes, for example, the electronic control board 6, the connector 2, the cover 3, the base 4, and a seal member 5.

The electronic control board 6 is provided with, for example, an electronic circuit that controls the vehicle. The electronic circuit is provided with, for example, an electronic component such as a memory or a central processing unit (CPU) in which a program is stored.

The connector 2 electrically connects, for example, a circuit of the vehicle and the electronic control board 6. The connector 2 is provided on one end side of the one surface 61 of the electronic control board 6.

The cover 3 protects the electronic control board 6 from foreign matters, liquid, or the like. The cover 3 is provided on a side of the one surface 61 of the electronic control board 6 and covers the electronic control board 6 and the connector 2. The cover 3 includes a plurality of bent portions 312 formed so as to be directed toward the electronic control board 6 side from a center side of the cover 3 toward both end sides of the cover 3.

The base 4 supports the electronic control board 6, the connector 2, and the cover 3. The base 4 is provided on the other surface 62 side of the electronic control board 6 so as to face the cover 3.

The seal member 5 suppresses intrusion of foreign matters, liquid, or the like into the electronic control unit 1. The seal member 5 is interposed between at least any two of the connector 2, the cover 3, and the base 4.

The connector 2 includes a connector main body 21 and a plurality of terminals 23 provided to protrude from the connector main body 21 to one end side of the electronic control board 6.

The connector main body 21 includes an attachment surface 24 attached to the electronic control board 6 and a surface 25 on a side facing the attachment surface 24. The connector main body 21 includes a seal arrangement portion 210, in which the seal member 5 is disposed, on the surface 25.

The seal arrangement portion 210 includes a first seal arrangement portion 211 and a second seal arrangement portion 212. The first seal arrangement portion 211 is formed in a longitudinal direction of the connector main body portion 21.

The first seal arrangement portion 211 includes a plurality of predetermined portions 2112 formed so as to be directed toward the electronic control board 6 side from the center side of the first seal arrangement portion 211 toward both end sides of the first seal arrangement portion at both end portions 213 of the first seal arrangement portion 211. Each of the predetermined portions 2112 is in contact with each of the bent portions 312. That is, the bent portion 312 covers each predetermined portion 212.

The second seal arrangement portion 212 is continuous with both end portions 213 of the first seal arrangement portion 211 and is inclined toward the electronic control board 6 as it goes toward the other end side facing the one end side of the electronic control board 6.

Each terminal 23 electrically connects the circuit of the vehicle and the electronic control board 6. The terminals 23 are arranged in the longitudinal direction of the connector main body 21.

The electronic control unit 1 described above can include the bent portion 312 in the cover 3 by including the predetermined portion 2112. When receiving a force to peel off the cover 3 from the connector 2 due to an increase in internal pressure or the like, the cover 3 including the bent portion 312 is less likely to be deformed than when the cover 3 is formed in a planar shape. As a result, the electronic control unit 1 can suppress a load on the seal member 5, and thus, waterproof reliability can be improved.

Embodiments of the electronic control unit 1 will be described with reference to the drawings.

First Embodiment

FIG. 1 is an exploded view of the electronic control unit 1. The electronic control unit 1 controls a vehicle, for example. The electronic control unit 1 includes, for example, the electronic control board 6, the connector 2, the cover 3, the base 4, and a seal member 5.

The electronic control board 6 is provided with, for example, an electronic component such as a memory or a CPU in which a program is stored. The electronic control board 6 is formed in, for example, a flat quadrangular shape. In the electronic control board 6, a through hole 611 penetrating from one surface 61 to the other surface 62 is formed at a position corresponding to a screw hole 44 to be described below. The electronic control board 6 is assembled to the base 4 by, for example, fastening screws in the through holes 611.

The connector 2 electrically connects, for example, a circuit of the vehicle and the electronic control board 6. The connector 2 is provided on the front side of the one surface 61 of the electronic control board 6. Note that the connector 2 may be electrically connected to the electronic control board 6 by soldering, press fitting, or the like.

The connector 2 includes the connector main body 21 and a plurality of terminals 23. The connector main body 21 is formed by a portion formed in the x-axis direction where each terminal 23 is provided and a portion formed in the depth direction from both end portions of the portion formed in the x-axis direction. The connector main body 21 is made of resin such as PolyButylene Terephthalate (PBT), Poly-Amide (PA), or Poly Phenylene Sulfide (PPS).

The connector main body 21 includes, for example, the attachment surface 24 attached to the electronic control board 6 and the surface 25 on the side facing the attachment surface 24. For example, a protrusion 241 protruding downward is formed on the attachment surface 24. The connector 2 is attached to the base 4 by the protrusion 241.

The surface 25 is provided with the seal arrangement portion 210 in which the seal member 5 is disposed. The seal arrangement portion 210 includes, for example, the first seal arrangement portion 211 and the second seal arrangement portion 212. The first seal arrangement portion 211 is formed in a longitudinal direction of the connector main body portion 21. The first seal arrangement portion 211 includes the plurality of predetermined portions 2112 and a flat surface seal arrangement portion 2111.

Each predetermined portion 2112 is provided, for example, at both end portions 213 of the first seal arrangement portion 211. Each predetermined portions 2112 is formed so as to be directed downward from the center side of the first seal arrangement portion 211 toward both end sides of the first seal arrangement portion.

The flat surface seal arrangement portion 2111 is provided between the predetermined portions 2112. In the first seal arrangement portion 211, the seal member 5 is disposed in the longitudinal direction of the connector main body 21.

The second seal arrangement portion 212 is continuous with both end portions 213 of the first seal arrangement portion 211 and is inclined toward the electronic control board 6 side as it goes in the depth direction. One lower end of the second seal arrangement portion 212 is in contact with the base-side seal arrangement portion 42.

Each terminal 23 is provided to protrude from the connector main body 21 to one end side of the electronic control board 6. The terminals 23 are arranged in the longitudinal direction of the connector main body 21. Each terminal 23 includes, for example, a resin portion 231 and a metal wire material (not illustrated). For example, the same member as that of the connector main body 21 may be used as the resin portion 231.

The cover 3 protects the electronic control board 6 from foreign matters, liquid, or the like. The cover 3 is provided on a side of the one surface 61 of the electronic control board 6 and covers the electronic control board 6 and the connector 2. The cover 3 includes an upper surface 31 provided in the upward direction of the electronic control board 6, a plurality of side surfaces 32 provided at both ends in the x-axis direction of the upper surface 31, a back surface 33 provided at one end in the depth direction of the upper surface 31, and a stopper 34.

The upper surface 31 includes, for example, a flat surface portion 311 formed in a planar shape and the plurality of bent portions 312. The flat surface portion 311 is positioned between the bent portions 312 in the x-axis direction. The bent portion 312 is formed so as to be directed downward from both ends of the flat surface portion 311 in the x-axis direction toward the side surface 32.

Each of the side surfaces 32 includes an inclined portion 321 on the front side. For example, the inclined portion 321 is formed so as to be directed downward as extending in the depth direction. That is, each side surface 32 is formed in, for example, a trapezoidal shape in which an upper side 322 is longer than a lower side 323.

The stopper 34 comes into contact with the base 4 when the cover 3 is attached to the base 4 and supports the cover 3. The stopper 34 is formed so as to protrude from each of the side surfaces 32 and the back surface 33, for example.

The base 4 supports the electronic control board 6, the connector 2, and the cover 3. The base 4 is provided on the other surface 62 side of the electronic control board 6 so as to face the cover 3. The base 4 includes, for example, a bottom surface 41, a base-side seal arrangement portion 42, an attachment bracket 43 which is an example of an "attachment portion", and the screw hole 44.

The bottom surface 41 is, for example, a quadrangular surface covering the downward direction of the electronic control board 6. The base-side seal arrangement portion 42 is provided on an outer edge portion of the bottom surface 41.

The base-side seal arrangement portion 42 is, for example, a groove formed along an outer edge of the bottom surface 41.

The seal member 5 is disposed in the base-side seal arrangement portion 42.

The electronic control unit 1 is attached to another device by each attachment bracket 43. The electronic control unit 1 is attached to the vehicle by, for example, each attachment bracket 43. The attachment brackets 43 are provided at both ends of the base 4 in the x-axis direction.

The screw hole 44 is, for example, a hole for attaching the electronic control board 6 to the base 4 with a screw. For example, a plurality of screw holes 44 are provided on the inner edge side of the base-side seal arrangement portion 42.

The cover 3 and the base 4 may be made of resin such as PBT, PPS, or PA, for example. The cover 3 and the base 4 may be formed of, for example, metal containing aluminum, iron, or the like as a main component.

The seal member 5 suppresses entry of liquid or foreign matters into the electronic control unit 1.

The seal member 5 may be, for example, an adhesive made of a material such as a silicon-based material, an epoxy-based material, or a urethane-based material. The seal member 5 may be, for example, an O-ring made of a rubber-based material.

Figure 2:
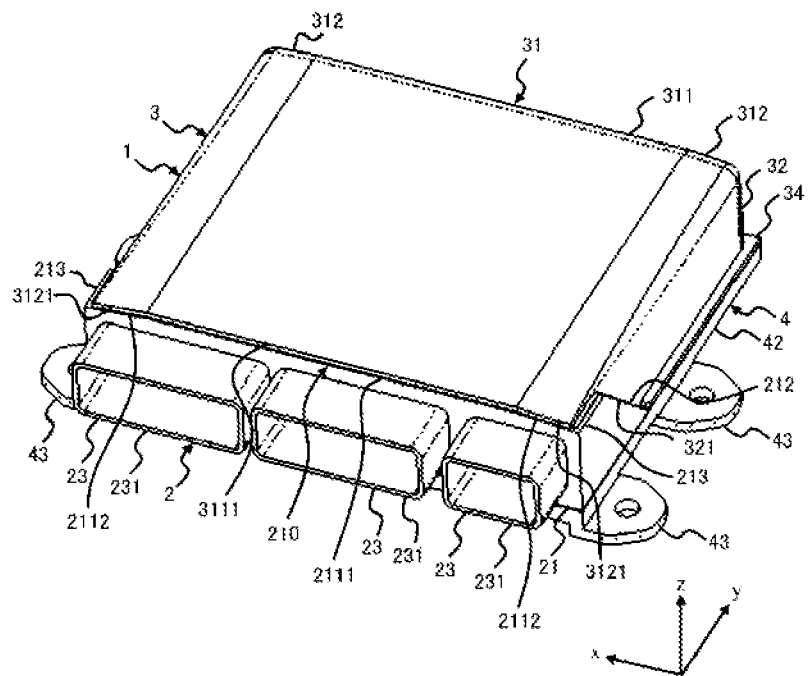
FIG. 2 is a perspective view of the electronic control unit.

The seal member 5 has an adhesive function. As illustrated in FIG. 2, the cover 3 is bonded to the connector 2. That is, the one end portion 3111 on the front side of the flat surface portion 311 of the cover 3 is bonded to the flat surface seal arrangement portion 2111 by the seal member 51 disposed in the flat surface seal arrangement portion 2111. One end portion 3121 on the front side of each bent portion 312 is bonded to each predetermined portion 2112 by a seal member 52 disposed at the predetermined portion 2112. The inclined portion 321 is adhered to the second seal arrangement portion 212 by the seal member 53 disposed in the second seal arrangement portion 212.

The connector 2 is bonded to the base 4. That is, the protrusion 241 of the connector 2 is bonded to the one side 421 on the front side and both end sides 422 of the base-side seal arrangement portion 42 by the seal member 54 disposed in the base-side seal arrangement portion 42.

The cover 3 is bonded to the base 4. That is, the lower side 323 of the side surface 32 of the cover 3 is adhered to both end sides 422 of the base-side seal arrangement portion 42 by the seal member 54.

The lower side of the back surface 33 of the cover 3 is bonded to one side on the depth side of the base-side seal arrangement portion 42 by the seal member 54.

Figure 3:
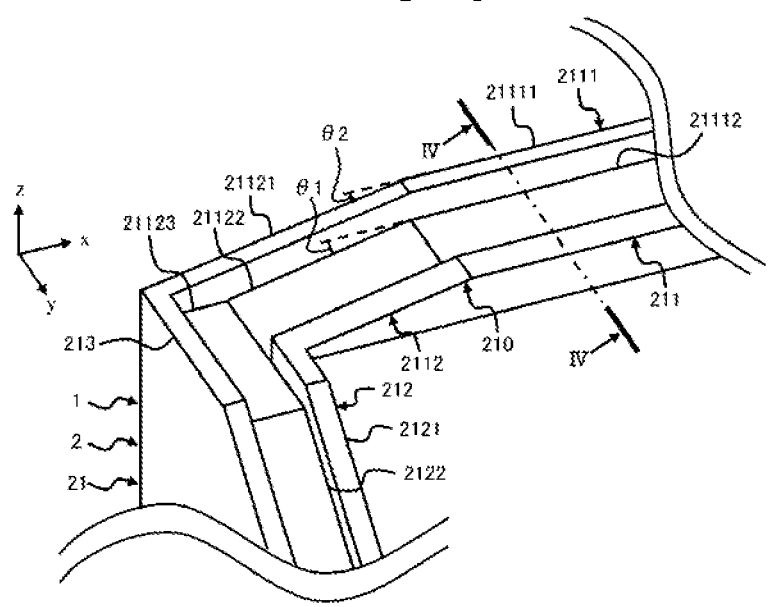
FIG. 3 is an explanatory view of a seal arrangement portion.

FIG. 3 is an explanatory view of the seal arrangement portion 210. The flat surface seal arrangement portion 2111 includes a flat surface-side groove portion 21112 and a flat surface-side bank portion 21111. The seal member 5 is disposed in the flat surface-side groove portion 21112. The flat surface-side bank portion 21111 suppresses leakage of the seal member 5. The flat surface-side bank portion 21111 is formed by the flat surface-side groove portion 21112.

The predetermined portion 2112 includes a predetermined groove portion 21122 continuous with the flat surface-side groove portion 21112, an end-side groove portion 21123 continuous with the predetermined groove portion 21122 and the second seal arrangement portion 212, and a predetermined bank portion 21121 formed by the predetermined groove portion 21122 and the end-side groove portion 21123.

The predetermined groove portion 21122 is formed in a shape directed toward the electronic control board 6 side from the center side of the first seal arrangement portion 211 toward both end sides of the first seal arrangement portion. The predetermined groove portion 21122 is formed in, for example, a slope shape directed toward the electronic control board 6 side at a constant angle θ1 from the center side of the first seal arrangement portion 211 toward both ends of the first seal arrangement portion 211.

The end-side groove portion 21123 is, for example, a groove formed in the y-axis direction. The end-side groove portion 21123 is positioned below the flat surface-side groove portion 21112.

The predetermined bank portion 21121 is formed in a slope shape directed toward the electronic control board side at a constant angle θ2 from the center side of the first seal arrangement portion 211 toward both ends of the first seal arrangement portion 211. The position of one end of the predetermined bank portion 21121 at both end portions 213 of the first seal arrangement portion 211 is positioned downward from the position of the flat surface-side bank portion 21111.

The second seal arrangement portion 212 includes an inclined bank portion 2121 and an inclined groove portion 2122. The inclined groove portion 2122 is a groove in which the seal member 5 is disposed. The inclined groove portion 2122 is continuous with the end-side groove portion 21123.

The inclined bank portion 2121 is formed by the inclined groove portion 2122. The inclined bank portion 2121 is continuous with the predetermined bank portion 21121 at both end portions 213 of the first seal arrangement portion 211.

Figure 4:
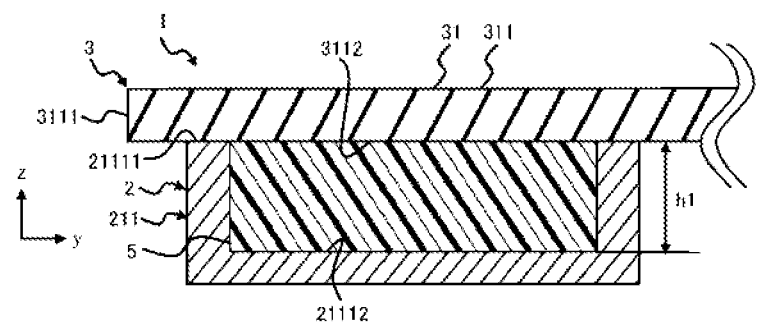
FIG. 4 is a schematic cross-sectional view of the electronic control unit illustrated in FIG. 3 taken along line IV-IV.

FIG. 4 is a schematic cross-sectional view of the electronic control unit illustrated in FIG. 3 taken along line IV-IV. The cover 3 is, for example, a flat surface type seal structure in which a lower surface 3112 of the cover 3 covers the first seal arrangement portion 211. That is, the cover 3 is bonded to the flat surface seal arrangement portion 2111 by being bonded to the seal member 5. In this case, the flat surface-side bank portion 21111 comes into contact with the lower surface 3112 of the cover 3. A depth dimension h1 of the flat surface-side groove portion 21112 is set to a length that can suppress leakage from the flat surface-side bank portion 21111 when the seal member 5 is applied to the flat surface-side groove portion 21112, for example.

The cover 3 is pushed and deformed from the inside by the increase in the internal pressure of the electronic control unit 1. At this time, the cover 3 tends to be separated upward from the seal member 5. The seal member 5 receives a load when one end on the front side of the cover 3 is deformed upward.

The magnitude of the load applied to the seal member 5 varies depending on rigidity against the upward deformation of the cover 3. That is, a magnitude of the load applied to the seal member varies depending on a magnitude of a cross-sectional secondary moment of the cover 3.

The electronic control unit 1 described above can include the bent portion 312 in the cover 3 by including the first seal arrangement portion 211. The cover 3 including the bent portion 312 has higher rigidity against a force applied in the upward direction than a cover formed in a planar shape. As a result, the cover 3 is less likely to be bent and deformed by the air pressure inside the electronic control unit 1. As a result, stress applied to the seal member 5 is suppressed, and waterproof reliability is improved.

A function of the electronic control unit is added along with high functionality of the vehicle. In the electronic control unit, the number of pins of the connector and the number of electronic components increase with addition of functions. As a result, the size of the electronic control unit increases as the functionality of the vehicle increases. However, along with the increase in size of the connector, it is difficult to secure a region where the seal arrangement portion is provided around the connector. Accordingly, the electronic control unit is required to be downsized.

In order to secure a space in a vehicle interior, an engine room in which the electronic control unit is disposed is densified by other devices. Accordingly, the electronic control unit mounted in the engine room is also required to be downsized.

In the electronic control unit 1, both end portions 213 of the first seal arrangement portion 211 are positioned in the lower direction than the flat surface seal arrangement portion 2111. The position of the upper end of the second seal arrangement portion 212 is positioned in the downward direction with respect to a case where the both end portions 213 of the first seal arrangement portion 211 are positioned on an extension line of the flat surface seal arrangement portion 2111 in the x-axis direction. Since the second seal arrangement portion 212 is inclined from a position closer to the base portion 4, the size in the y-axis direction is reduced. As a result, since the connector 2 is downsized, the electronic control unit 1 can be downsized. By reducing the size of the connector 2, a cost for manufacturing the electronic control unit 1 can be reduced.

As the cover, for example, an insertion type seal structure is conceivable in which the cover is bonded to the connector by inserting the protrusion provided on the cover or one end of the cover into the seal member disposed in the connector. However, a depth dimension of the groove of the insertion type seal structure is longer than a length of the cover to be inserted. As a result, the depth dimension of the groove of the insertion type seal structure is longer than the depth dimension of the groove of the flat surface type seal structure. Since the first seal arrangement portion 211 has the flat surface type seal structure, the size of the electronic control unit 1 in the z-axis direction can be made smaller than that of the insertion type seal structure.

Since the seal member 5 has the adhesive function, at least any two of the connector 2, the cover 3, and the base 4 can be adhered. This improves assembly performance of the electronic control unit 1.

The cover 3 can easily form the bent portion 312 by being formed of resin. The cover 3 may be made of metal. In this case, the cover 3 releases heat of air inside the electronic control unit 1 to the outside. As a result, the cover 3 can suppress an increase in the air pressure inside the electronic control unit 1.

Second Embodiment

Figure 5:
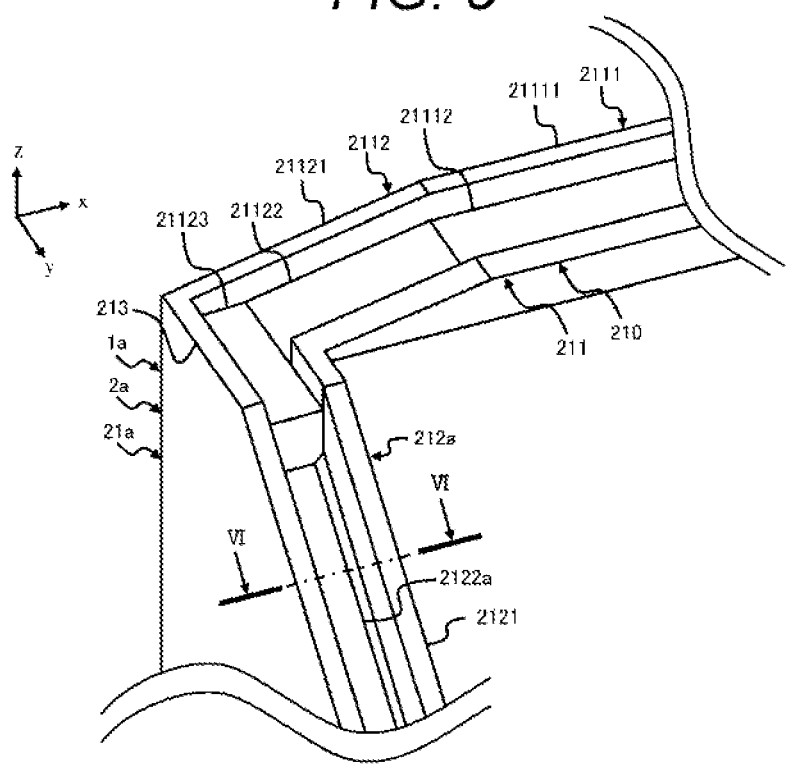
FIG. 5 is an explanatory view of a second seal arrangement portion in a second embodiment.

Since the present embodiment corresponds to a modification of the first embodiment, differences from the first embodiment will be mainly described. FIG. 5 is an explanatory view of a second seal arrangement portion 212a. The second seal arrangement portion 212a is continuous with both end portions 213 of the first seal arrangement portion 211 and is inclined downward as it goes in the depth direction.

The second seal arrangement portion 212a includes the inclined bank portion 2121 and an inclined groove portion 2122a. The inclined groove portion 2122a is a groove in which the seal member 5 is disposed. The inclined groove portion 2122a is continuous with the end-side groove portion 21123. The inclined groove portion 2122a is an insertion type seal structure in which the inclined portion 321 is inserted into the seal member 5 disposed in the inclined groove portion 2122a.

Figure 6:
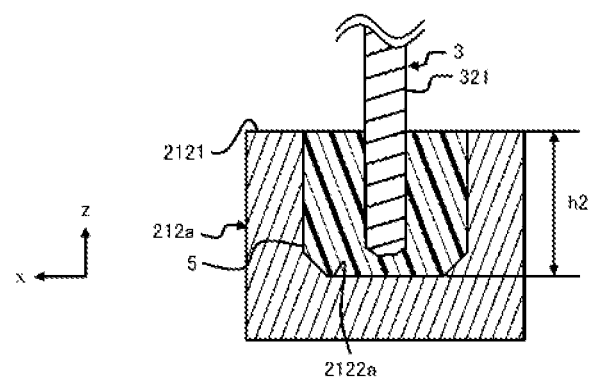
FIG. 6 is a schematic cross-sectional view of the second seal arrangement portion illustrated in FIG. 5 taken along line VI-VI.

FIG. 6 is a schematic cross-sectional view of the second seal arrangement portion 212a illustrated in FIG. 5 taken along line VI-VI. A depth dimension h2 of the inclined groove portion 2122a is formed to be longer than a depth dimension h1 of the flat surface-side groove portion 21112. The depth dimension h2 of the inclined groove portion 2122a is longer than the length in which the side surface 32 of the cover 3 is inserted, for example.

The seal member 5 is disposed in the inclined groove portion 2122a. The cover 3 is bonded to the connector 2a by inserting the inclined portion 321 of the cover 3 into the seal member 5 disposed in the inclined groove portion 2122a. Note that the inclined groove portion 2122a is not limited to a rectangular shape, and may have an inclined surface in the x-axis direction.

A holding force by the seal member 5 is proportional to a contact area between each member and the seal member 5. In the case of the flat surface type seal structure, the contact area between the cover 3 and the seal arrangement portion 210 can be increased by increasing the width of the inclined groove portion 2122a of the second seal arrangement portion 212a in the x-axis direction. However, as the second seal member 212a expands in the x-axis direction, the size of an electronic control unit 1a increases in the x-axis direction.

Since the electronic control unit 1a described above includes the inclined groove portion 2122a, the inclined portion 321 can be inserted into the seal member 5 disposed in the second seal arrangement portion 212a.

As a result, the contact area between the inclined portion 321 and the seal member 5 can be made larger than that in the case of the flat surface type seal structure without enlarging the second seal arrangement portion 212a in the x-axis direction. As a result, the electronic control unit 1a can improve the holding force of the seal member 5 of the cover 3. Since the deformation of the cover 3 can be suppressed by improving the holding force of the cover 3, the electronic control unit 1a can suppress the stress generated in the flat surface seal arrangement portion 2111.

Third Embodiment

Figure 7:
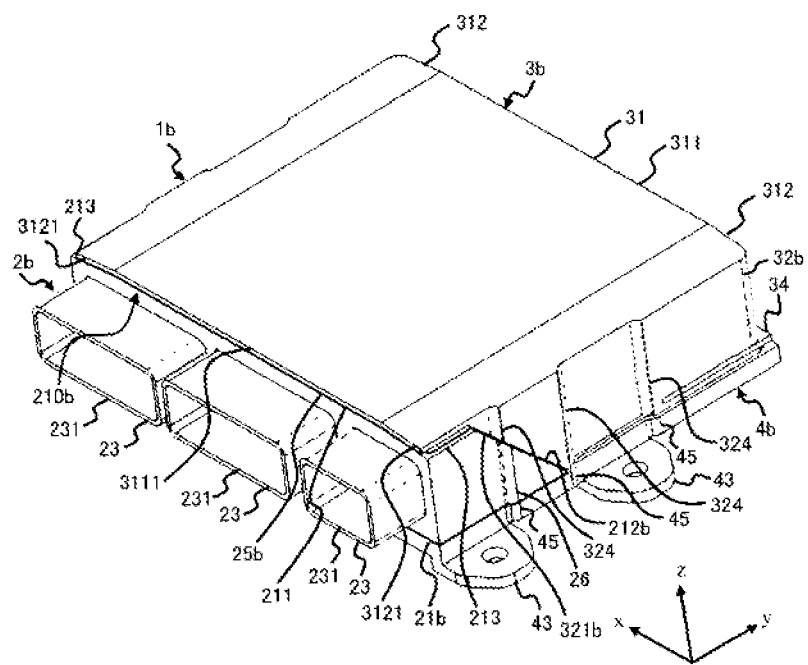
FIG. 7 is a perspective view of an electronic control unit according to a third embodiment.

Since the present embodiment corresponds to the modification of the first embodiment and the second embodiment, differences from the first embodiment and the second embodiment will be mainly described. FIG. 7 is a perspective view of an electronic control unit 1b. A connector 2b of the electronic control unit 1b is provided with a curved portion 2123. The electronic control unit 1b includes, for example, the electronic control board 6, a connector 2b, a cover 3b, a base 4b, and the seal member 5.

The connector 2b electrically connects, for example, a circuit of the vehicle and the electronic control board 6. The connector 2b includes a connector main body 21b and a plurality of terminals 23. The connector main body 21b is formed by a portion formed in the x-axis direction where each terminal 23 is provided and a portion formed in the depth direction from both end portions of the portion formed in the x-axis direction. A curved portion 26 is formed in a portion formed in the depth direction. The curved portion 26 will be described below with reference to FIG. 8.

The connector main body 21b includes, for example, the attachment surface 24 attached to the electronic control board 6 and a surface 25b on a side facing the attachment surface 24. The surface 25b is provided with a seal arrangement portion 210b where the seal member 5 is placed. The seal arrangement portion 210b includes, for example, a first seal arrangement portion 211 and a second seal arrangement portion 212b. The second seal arrangement portion 212b will be described below with reference to FIG. 8.

The cover 3b protects the electronic control board 6 from foreign matters, liquid, or the like. The cover 3b is provided on the one surface 61 side of the electronic control board 6 and covers the electronic control board 6 and the connector 2b. The cover 3b includes an upper surface 31 positioned in the upward direction of the electronic control board 6, a plurality of side surfaces 32b provided at both ends in the x-axis direction of the upper surface 31, and a back surface 33 provided on the depth side of the upper surface 31.

The side surface 32b includes, for example, an inclined portion 321b formed on the front side and a plurality of curved portions 324. The inclined portion 321b is formed so as to be directed to downward as going in the depth direction. The curved portion 324 will be described below.

The base 4b supports the electronic control board 6, the connector 2b, and the cover 3b. The base 4b is provided on the other surface 62 side of the electronic control board 6 so as to face the cover 3b. The base 4b includes, for example, a bottom surface 41, a base-side seal arrangement portion 42, an attachment bracket 43, a screw hole 44, and a curved portion 45. The curved portion 45 will be described below.

Figure 8:
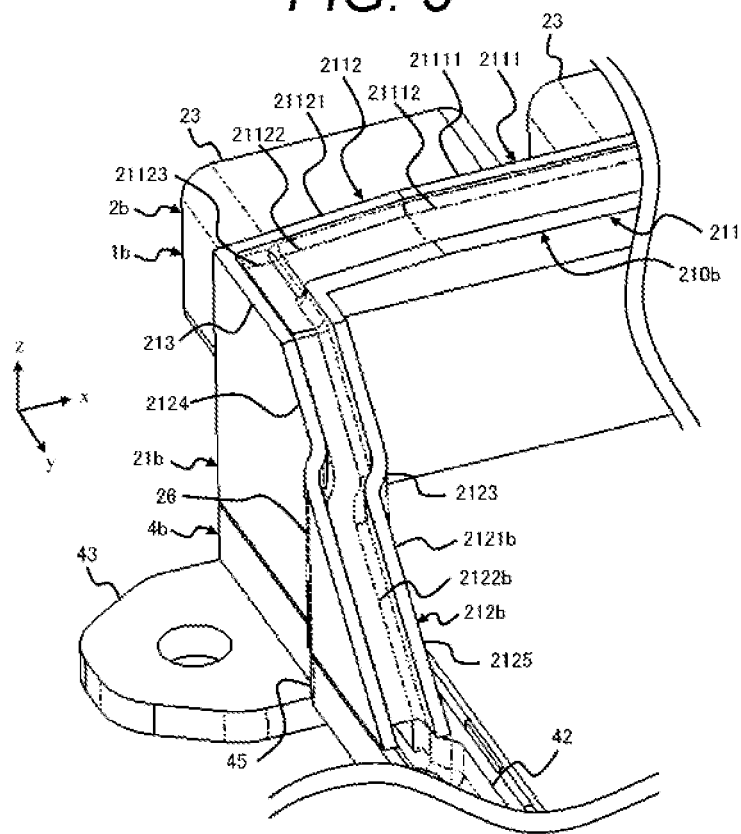
FIG. 8 is an explanatory view of a second seal arrangement portion.

FIG. 8 is an explanatory view of the second seal arrangement portion 212b. The second seal arrangement portion 212b is continuous with both end portions 213 of the first seal arrangement portion 211 and is inclined downward as it goes in the depth direction.

The second seal arrangement portion 212b includes a curved portion 2123 curved in the longitudinal direction of the connector main body portion 21b. That is, the second seal arrangement portion 212b includes the upper inclined portion 2124 continuous with both end portions 213 of the first seal arrangement portion 211 and the lower inclined portion 2125 in contact with the base-side seal arrangement portion 42. The upper inclined portion 2124 and the lower inclined portion 2125 are connected by a curved portion 2123. Note that an inclination direction of the upper inclined portion 2124 and an inclination direction of the lower inclined portion 2125 may have a parallel relationship of being separated from each other in the x-axis direction.

The lower inclined portion 2125 is positioned outside the upper inclined portion 2124 in the x-axis direction.

The outside is a direction from the central portion of the first seal arrangement portion 211 to both end portions 213. The lower inclined portion 2125 may be positioned on the center side in the x-axis direction with respect to the upper inclined portion 2124.

The second seal arrangement portion 212b includes an inclined bank portion 2121b and an inclined groove portion 2122b. The inclined groove portion 2122b is a groove in which the seal member 5 is disposed. The inclined groove portion 2122b is continuous with the end-side groove portion 21123. The inclined groove portion 2122b is curved in the x-axis direction at the curved portion 2123.

The inclined bank portion 2121b is formed by the inclined groove portion 2122b. The inclined bank portion 2121b is continuous with the predetermined bank portion 21121 at both end portions 213 of the first seal arrangement portion 211. The inclined bank portion 2121b is curved in the x-axis direction at the curved portion 2123.

The curved portion 26 forms the shape of the curved portion 2123 to the attachment surface 24 in the downward direction of the curved portion 2123. That is, the curved portion 26 is curved in the x-axis direction.

Returning to FIG. 7, the curved portion 324 of the side surface 32b of the connector 2b is formed at a position corresponding to the curved portion 2123 of the second seal arrangement portion 212b. That is, the curved portion 324 is formed in a shape that can be inserted into the inclined groove portion 2122b of the curved portion 2123. The curved portion 324 is formed in the upward direction of the curved portion 2123.

The curved portions 45 formed at both ends in the x-axis direction of the base 4b are formed at positions corresponding to the curved portions 2123 of the second seal arrangement portion 212b. That is, the curved portion 324 is formed in the downward direction of the curved portion 26.

Note that the curved portion 324 and the curved portion are not limited to positions corresponding to the curved portion 2123, and may be formed in the depth direction from the connector main body 21b. In this case, the shapes of the curved portion 324 and the curved portion 45 correspond to each other. The curved portion 324 and the curved portion 45 are not limited to being curved outward in the x-axis direction, and may be curved inward in the x-axis direction.

Figure 9:
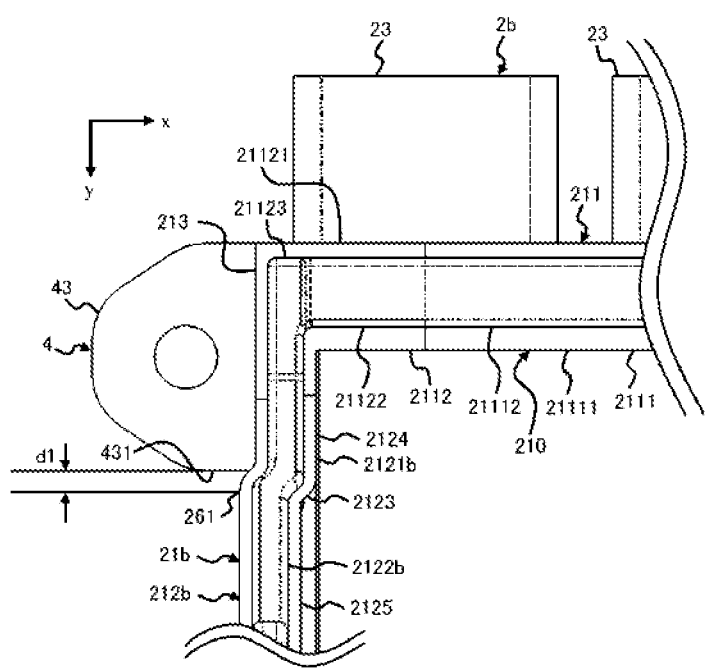
FIG. 9 is an explanatory view of a curved portion.

FIG. 9 is an explanatory view of the curved portion 2123. The curved portion 2123 is provided at a position of the second seal arrangement portion 212b on the other end side of the attachment bracket 43 provided on one end side of the electronic control board 6. The curved portion 2123 includes an outer portion 261 positioned outside the upper inclined portion 2124. The outer portion 261 is formed at a position away from the one end portion 432 on the depth side of the attachment bracket 43 by a predetermined distance d1.

Since the electronic control unit 1b described above includes the curved portion 2123, the curved portion 324 can be provided on the side surface 32b of the cover 3. As a result, in the cover 3, the rigidity of the cover 3 with respect to the air pressure inside the electronic control unit 1 increases as compared with the cover in which the curved portion 324 is not formed. Accordingly, deformation of the cover 3 can be suppressed.

The second seal arrangement portion 212b where the curved portion 2123 is formed can be formed longer than a seal arrangement portion that is not curved. As a result, the electronic control unit 1b can improve the adhesive force by providing the curved portion 2123 in the second seal arrangement portion 212b. As a result, the electronic control unit 1b can improve the waterproof reliability.

Since the curved portion 2123 is formed in the depth direction from the attachment bracket 43, the electronic control unit 1b can improve the adhesive force without increasing a size of the attachment bracket 43 in the outer direction.

Since the electronic control unit 1b includes the curved portion 2123 curved outward, the internal space of the electronic control unit 1b can increase as compared with a case where the curved portion 2123 is not provided. As a result, the electronic control unit 1b can include a larger electronic control board. As a result, since the number of electronic components provided on the electronic control board can increase, the electronic control unit 1b can cope with high functionality.

Fourth Embodiment

Figure 10:
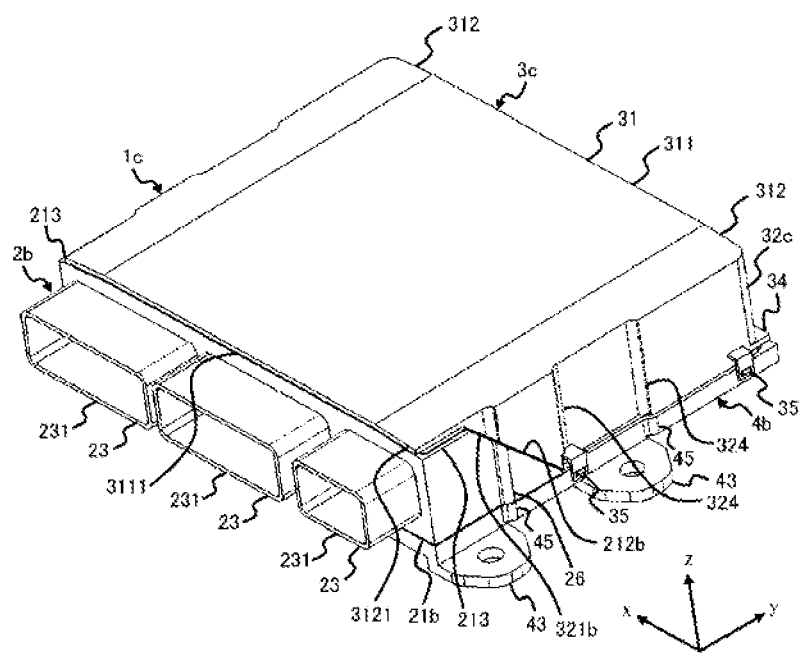
FIG. 10 is a perspective view of an electronic control unit according to a fourth embodiment.

The present embodiment corresponds to modifications of the first to third embodiments, and thus differences from the first to third embodiments will be mainly described. FIG. 10 is a perspective view of an electronic control unit 1c. The electronic control unit 1c includes, for example, the electronic control board 6, the connector 2b, a cover 3c, the base 4b, and the seal member 5.

The cover 3c includes the upper surface 31 positioned in the upward direction of the electronic control board 6, a plurality of side surfaces 32c provided at both ends in the x-axis direction of the upper surface 31, and the back surface 33 provided on the depth side of the upper surface 31.

The side surface 32c includes, for example, the inclined portion 321b formed on the front side, the plurality of curved portions 324, and a fastening portion 35.

The cover 3 is attached to the base 4 by a fastening portion 35. The fastening portion 35 may be, for example, a snap fit to be fitted using elasticity of the material of the cover 3c. Note that the fastening portion 35 is not limited to the snap-fit, and may be screwed, heat-staked, bonded, welded, or the like. The fastening portion 35 is provided, for example, in the depth direction with respect to the connector main body 21b.

The electronic control unit 1c can more firmly attach the cover 3 to the base 4 by including the fastening portion 35. As a result, the electronic control unit 1c can improve the waterproof reliability.

Fifth Embodiment

Figure 11:
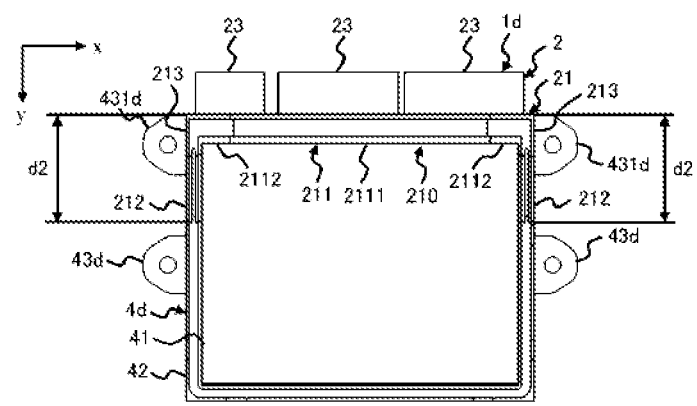
FIG. 11 is an explanatory view of an attachment bracket in a fifth embodiment.

The present embodiment corresponds to modifications of the first to fourth embodiments, and thus differences from the first to fourth embodiments will be mainly described. FIG. 11 is an explanatory view of an attachment bracket 43d. The electronic control unit 1d includes, for example, an electronic control board 6, a connector 2, a cover 3, a base 4d, and a seal member 5.

The base 4d supports the electronic control board 6, the connector 2, and the cover 3. The base 4d is provided on the other surface 62 side of the electronic control board 6 so as to face the cover 3. The base 4d includes, for example, the bottom surface 41, the base-side seal arrangement portion 42, the attachment bracket 43d, and the screw hole 44.

The electronic control unit 1d is attached to another device by the attachment bracket 43d. The plurality of attachment brackets 431d positioned in the front direction are disposed on both sides of the connector 2. That is, the plurality of attachment brackets 431d positioned in the front direction are disposed in predetermined regions d2 at both ends of the base 4d positioned outside the connector main body 21 in the x-axis direction.

Vibration, impact, or the like is applied from the vehicle to the electronic control unit 1d connected to the vehicle. As the distance from the portion fixed by the attachment bracket 43d increases, the influence of resonance due to vibration, impact, or the like increases, and the load on the seal member 5 increases.

In the electronic control unit 1d described above, the attachment bracket 43d is provided in the predetermined region d2 of the base 4d, and thus, the periphery of the connector 2 is firmly fixed to the vehicle. As a result, the electronic control unit 1d can suppress the influence of vibration, impact, or the like from the vehicle on the connector 2. Accordingly, the electronic control unit 1d can suppress a load applied to the seal member 5. As a result, the electronic control unit 1d can improve waterproof reliability.

The electronic control unit 1d can suppress deformation of the periphery of the connector 2 to the seal member 5 caused by stress applied to the connector 2 when the connector 2 is fitted to the terminal of the electronic circuit of the vehicle. Accordingly, the electronic control unit 1d can suppress a load applied to the seal member 5. As a result, the electronic control unit 1d can improve waterproof reliability.

Sixth Embodiment

Figure 12:
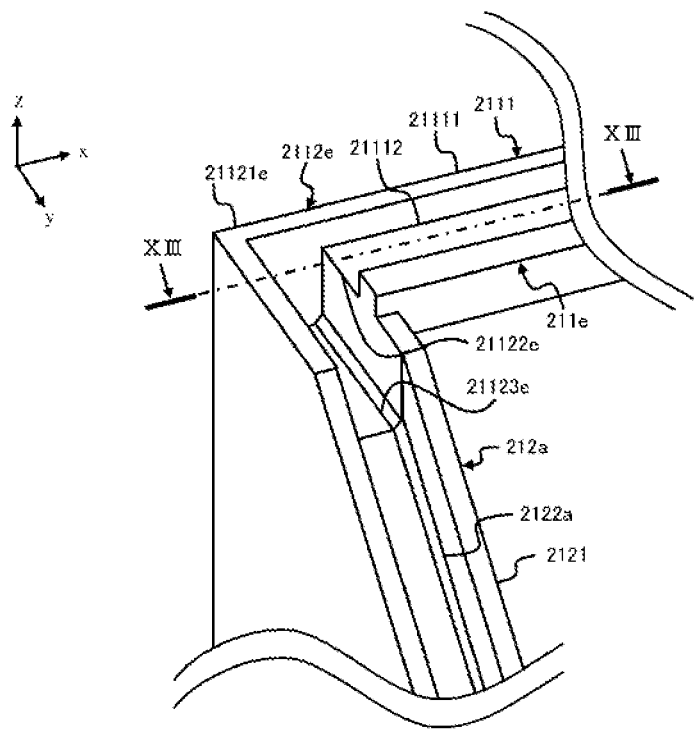
FIG. 12 is an explanatory view of a seal arrangement portion in a sixth embodiment.

The present embodiment corresponds to modifications of the first to fifth embodiments, and thus differences from the first to fifth embodiments will be mainly described. FIG. 12 is an explanatory view of a first seal arrangement portion 211e.

The first seal arrangement portion 211e includes a predetermined groove portion 21122e having a step shape.

The first seal arrangement portion 211 includes a plurality of predetermined portions 2112e and the flat surface seal arrangement portion 2111.

Each predetermined portion 2112e is provided, for example, at both end portions 213 of the first seal arrangement portion 211e. Each predetermined portion 2112e is formed so as to be directed toward the electronic control board 6 side from the center side of the first seal arrangement portion 211e toward both end sides of the first seal arrangement portion 211e.

The predetermined portion 2112e includes a predetermined groove portion 21122e continuous with the flat surface-side groove portion 21112, an end-side groove portion 211e positioned at both end portions 213 of the first seal arrangement portion 21122e and continuous with the predetermined groove portion 21123e and the second seal arrangement portion 212, and a predetermined bank portion 21122e formed by the predetermined groove portion 21123e and the end-side groove portion 21121e.

The predetermined groove portion 21122e is formed in a stepped shape from both ends of the flat surface-side groove portion 21112 toward the end-side groove portion 21123e in the lateral direction of the connector main body 21e. The end-side groove portion 21123e is positioned in the lower direction than the flat surface-side groove portion 21112. That is, the predetermined groove portion 21122e is formed so as to connect the flat surface-side groove portion 21112 and the end-side groove portion 21123 in the z-axis direction. The predetermined bank portion 21121e is formed, for example, in the x-axis direction and is continuous with the flat surface-side bank portion 21111.

Figure 13:
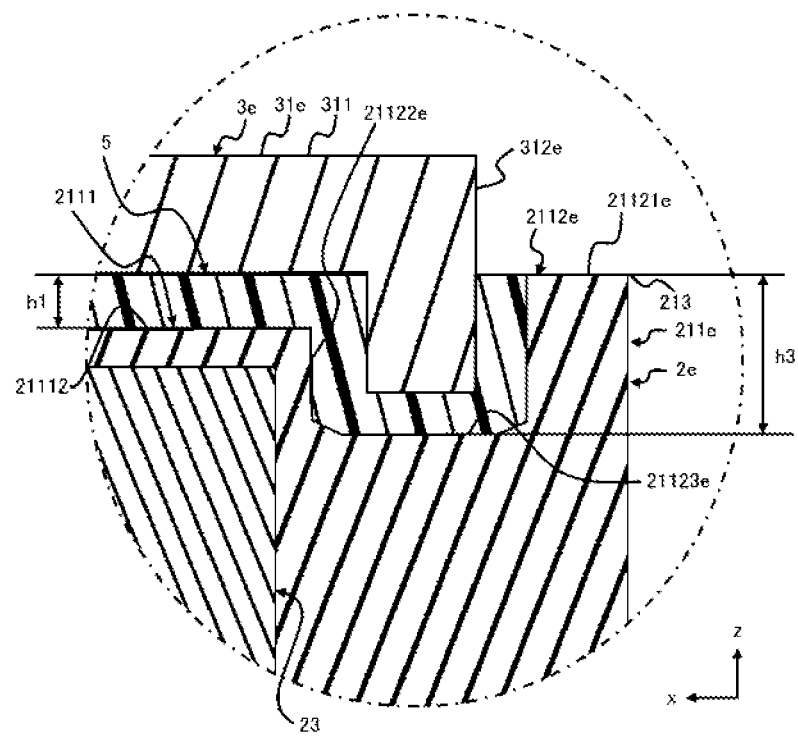
FIG. 13 is a schematic cross-sectional view of the seal arrangement portion illustrated in FIG. 12 taken along line XIII-XIII.

FIG. 13 is a schematic cross-sectional view of the seal arrangement portion 210e illustrated in FIG. 12 taken along line XIII-XIII. A cover 3e for protecting the electronic control board 6 from foreign matters, liquid, or the like is bonded to the connector 2e by a seal member 5.

The cover 3e is provided on the one surface 61 side of the electronic control board 6 and covers the electronic control board 6 and the connector 2e. The cover 3e includes an upper surface 31e positioned in the upward direction of the electronic control board 6, a plurality of side surfaces 32 provided at both ends of the upper surface 31e in the x-axis direction, and a back surface 33 provided on the depth side of the upper surface 31e.

The upper surface 31e includes the flat surface portion 311 and bent portions 312e provided at both ends of the flat surface portion 311 in the x-axis direction. The bent portion 312e is formed, for example, downward from both ends of the flat surface portion 311. The bent portion 312e is inserted into the seal member 5 disposed in the end-side groove portion 21123e.

The depth dimension h3 of the end-side groove portion 21123e may be longer than the depth dimension h1 of the flat surface-side groove portion 21112. The depth dimension h3 of the end-side groove portion 21123e is set to, for example, a length into which the end portion of the bent portion 312e is inserted.

Since the first seal arrangement portion 211e described above includes the predetermined groove portion 21122e, the depth dimension h3 of the end-side groove portion 21123e can be made longer than the depth dimension h1 of the flat surface-side groove portion 21112. As a result, it is possible to provide an insertion seal structure in which the bent portion 312e of the cover 3 is inserted into the seal member 5 disposed in the end-side groove portion 21123e.

The contact area between the seal member 5 and the bent portion 312 is larger than the contact area between the seal member and the bent portion in the case of the flat surface type seal structure. As a result, the predetermined groove portion 21122e can improve the holding force of the cover 3e.

Since the first seal arrangement portion 211e described above includes the predetermined groove portion 21122e having a step shape, the cover portion 3e can include the bent portion 312e. Since the cover 3e includes the bent portion 312e, the cover 3e is less likely to be deformed in a stripping direction as compared with the case of a planar shape without the bent portion 312e. Accordingly, the cover 3e can suppress stress on the seal member 5.

Seventh Embodiment

Figure 14:
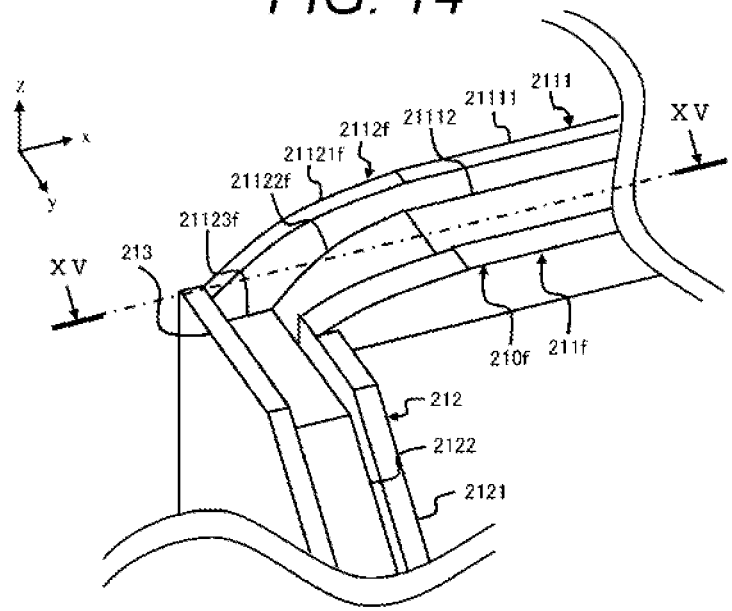
FIG. 14 is an explanatory view of a seal arrangement portion in a seventh embodiment.

The present embodiment corresponds to modifications of the first to sixth embodiments, and thus differences from the first to sixth embodiments will be mainly described. FIG. 14 is an explanatory view of a first seal arrangement portion 211f.

The first seal arrangement portion 211f includes arc-shaped predetermined portions 2112f at both ends.

The first seal arrangement portion 211f includes a plurality of predetermined portions 2112f and the flat surface seal arrangement portion 2111.

Each predetermined portion 2112f is provided, for example, at both end portions 213 of the first seal arrangement portion 211f. Each predetermined portion 2112f is formed so as to be directed toward the electronic control board 6 side from the center side of the first seal arrangement portion 211f toward both end sides of the first seal arrangement portion 211f.

The predetermined portion 2112f includes a predetermined groove portion 21122f continuous with the flat surface-side groove portion 21112, an end-side groove portion 211f positioned at both end portions 213 of the first seal arrangement portion 21122f and continuous with the predetermined groove portion 21123f and the second seal arrangement portion 212, and a predetermined bank portion 21121f formed by the predetermined groove portion 21122 and the end-side groove portion 21123.

The predetermined groove portion 21122f is formed in a shape directed toward the electronic control board 6 side from the center side of the first seal arrangement portion 211f toward both end sides of the first seal arrangement portion 211f.

The predetermined groove portion 21122f has, for example, an arc shape in which an inclination of a tangent of the predetermined groove portion 21122f in the x-axis direction gradually changes from one end of the predetermined groove portion 211f on the central side of the first seal arrangement portion 21122f toward the other end of the predetermined groove portion 211f on both end sides of the first seal arrangement portion 21122f. The end-side groove portion 21123 is positioned below the flat surface-side groove portion 21112.

The predetermined bank portion 21121f has an arc shape in which the inclination of the tangent of the predetermined bank portion 21121f in the x-axis direction gradually changes from one end of the predetermined bank portion 211f on the central side of the first seal arrangement portion 21121f toward the other end of the predetermined bank portion 211f at both ends of the first seal arrangement portion 21121f.

Figure 15:
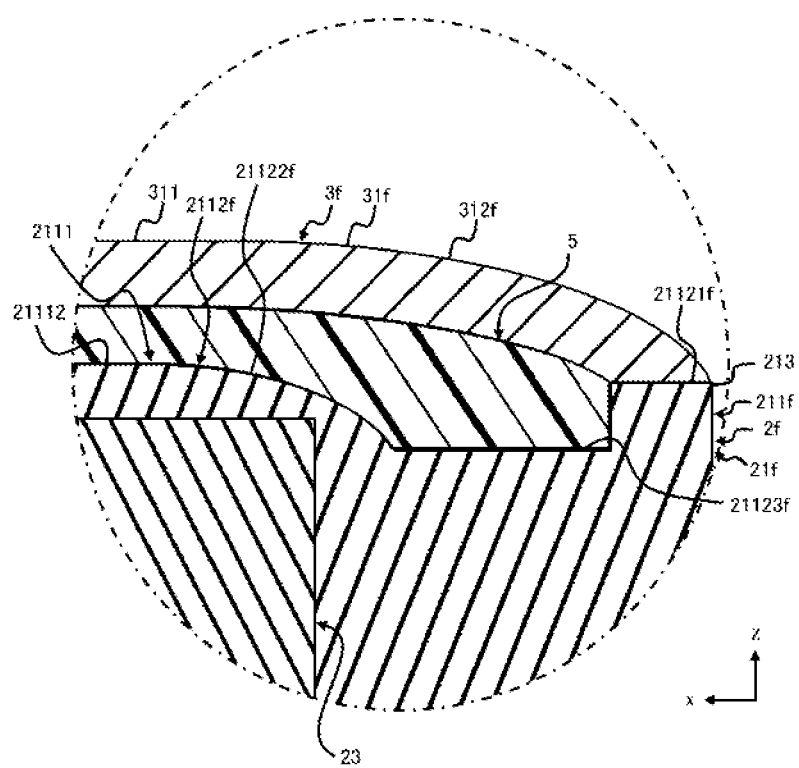
FIG. 15 is a schematic cross-sectional view of the seal arrangement portion illustrated in FIG. 14 taken along line XV-XV.

FIG. 15 is a schematic cross-sectional view of the first seal arrangement portion 211f illustrated in FIG. 14 taken along line XV-XV. A cover 3f for protecting the electronic control board 6 from foreign matters, liquid, or the like is bonded to the connector 2f by a seal member 5.

The cover 3f is provided on the one surface 61 side of the electronic control board 6 and covers the electronic control board 6 and the connector 2f. The cover 3f includes an upper surface 31f positioned in the upward direction of the electronic control board 6, a plurality of side surfaces 32 provided at both ends of the upper surface 31f in the x-axis direction, and a back surface 33 provided on the depth side of the upper surface 31f.

The upper surface 31f includes a flat surface portion 311 and bent portions 312f provided at both ends of the flat surface portion 311 in the x-axis direction. The bent portion 312f has, for example, an arc shape in which the inclination of the tangent line of the bent portion 312f on the flat surface portion 311 side gradually changes toward the other end of the bent portion 312f at both ends of the cover 3f. Both end portions of the cover 3f are in contact with both end portions 213 of the first seal arrangement portion 211f.

Since the first seal arrangement portion 211f described above includes the arc-shaped groove portion 21122f, the seal member 5 gradually moves from the flat surface-side groove portion 21112 to the end-side groove portion 21123f. Accordingly, since the seal member 5 is applied to the first seal arrangement portion 211f, assembly performance can be improved.

Eight Embodiment

Figure 16:
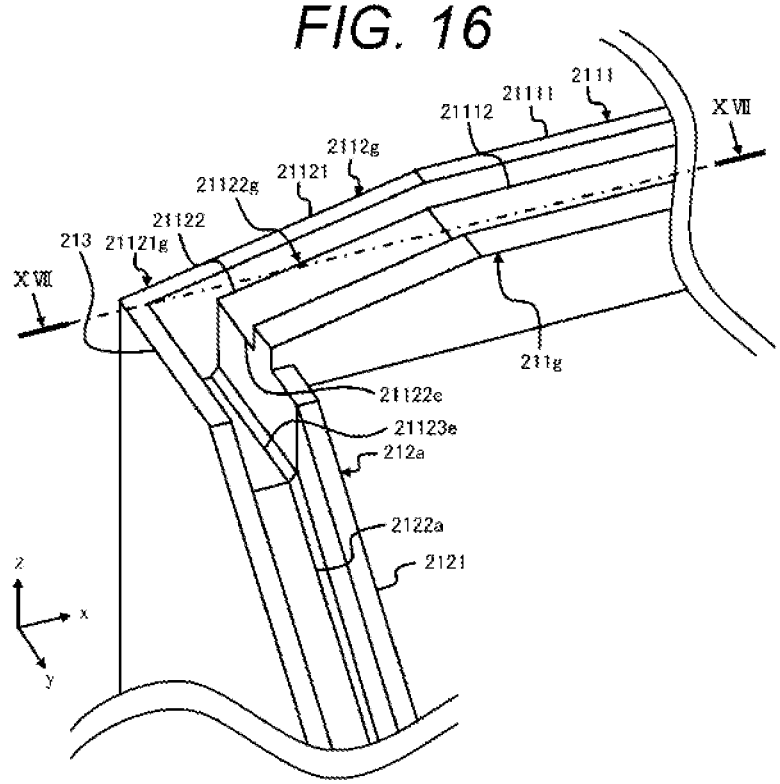
FIG. 16 is an explanatory view of a seal arrangement portion in an eighth embodiment.

The present embodiment corresponds to modifications of the first to eighth embodiments, and thus differences from the first to eighth embodiments will be mainly described. FIG. 16 is an explanatory view of a first seal arrangement portion 211g.

The first seal arrangement portion 211g includes a plurality of predetermined portions 2112g and the flat surface seal arrangement portion 2111.

Each predetermined portion 2112g is provided, for example, at both end portions 213 of the first seal arrangement portion 211g. Each predetermined portion 2112g is formed so as to be directed toward the electronic control board 6 side from the center side of the first seal arrangement portion 211g toward both end sides of the first seal arrangement portion 211g.

The predetermined portion 2112g includes a predetermined groove portion 21122g, an end-side groove portion positioned at both end portions 213 of the first seal arrangement portion 211g and continuous with the predetermined groove portion 21122g and the second seal arrangement portion 212, and a predetermined bank portion 21122g formed by the predetermined groove portion 21121g and the end-side groove portion 21123.

The predetermined groove portion 21122g is a combination of at least two of the predetermined groove portion 21122 having a slope shape, the predetermined groove portion 21122e having a step shape, and the groove portion 21122f having an arc shape. The predetermined groove portion 21122g is formed by, for example, a combination of a predetermined groove portion 21122 having a slope shape and a predetermined groove portion 21122e having a step shape.

That is, the predetermined groove portion 21122g includes, for example, a plurality of predetermined groove portions 21122 having a slope shape at both ends of the flat surface-side groove portion 21112. The predetermined groove portion 21122g includes, for example, a stepped groove portion 21122e at one end of each predetermined groove portion 21122 having a slope shape on both end sides of the first seal arrangement portion 211g.

The end-side groove portion of the first seal arrangement portion 211g is, for example, an end-side groove portion 21123e. The end-side groove portion of the first seal arrangement portion 211g is not limited to the end-side groove portion 21123e, and may be the end-side groove portion 21123, the end-side groove portion 21123f, or the like.

The predetermined bank portion 21121g is at least one of a predetermined bank portion 21121 having a slope shape or a predetermined bank portion 21121f having an arc shape. The predetermined bank portion 21121g is, for example, a predetermined bank portion 21121 having a slope shape.

Figure 17:
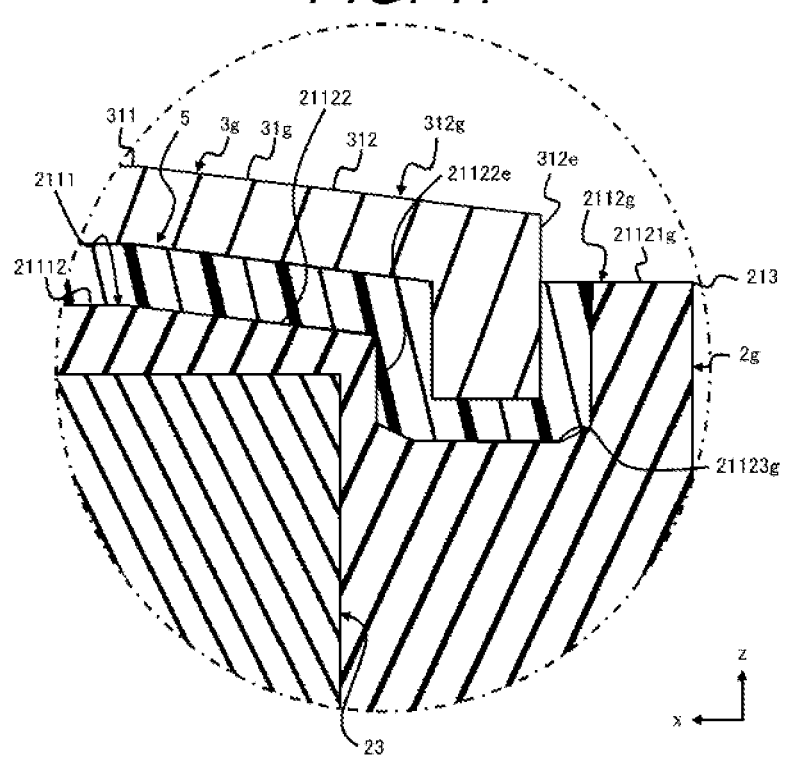
FIG. 17 is a schematic cross-sectional view of the seal arrangement portion illustrated in FIG. 16 taken along line XVII-XVII.

FIG. 17 is a schematic cross-sectional view of the seal arrangement portion 210f illustrated in FIG. 16 taken along line XVII-XVII. A cover 3g for protecting the electronic control board 6 from foreign matters, liquid, or the like is bonded to the connector 2g by a seal member 5.

The cover 3g is provided on the one surface 61 side of the electronic control board 6 and covers the electronic control board 6 and the connector 2g. The cover 3g includes an upper surface 31g positioned in the upward direction of the electronic control board 6, a plurality of side surfaces 32 provided at both ends in the x-axis direction of the upper surface 31g, and a back surface 33 provided on the depth side of the upper surface 31g.

The upper surface 31g includes a flat surface portion 311 and bent portions 312g provided at both ends of the flat surface portion 311 in the x-axis direction. The bent portion 312g is a combination of at least two or more of a bent portion 312 having a slope shape, a bent portion 312e having a step shape, and a bent portion 312f having an arc shape.

The bent portion 312g is formed by, for example, a combination of a bent portion 312 having a slope shape and a bent portion 312e having a step shape.

Since the first seal arrangement portion 211g described above includes the predetermined groove portion 21122 having an inclined shape and the predetermined groove portion 21122e having a step shape, the cover 3g can include the bent portion 312 and the bent portion 312e. Since the cover 3g includes the bent portion 312 and the bent portion 312e, rigidity against a force in a direction in which the cover 3g is peeled off from the connector 2g can be improved. Accordingly, the cover 3g can suppress a load on the seal member 5.

Note that the present invention is not limited to the above-described embodiments, and includes various modifications. For example, the above embodiments are described in detail for the purpose of clearly explaining the present invention, and are not necessarily limited to those including all the configurations described. Further, a portion of the configurations of an embodiment can be replaced with the configurations of another embodiment. In addition, the configurations of another embodiment can be added to the configurations of an embodiment. Further, it is possible to perform addition/deletion/replacement on other configurations with respect to a portion of the configurations of each embodiment.

REFERENCE SIGNS LIST 1 electronic control unit
2 connector
3 cover
4 base
5 seal member
6 electronic board
21 connector main body
210 seal arrangement portion
211 first seal arrangement portion
2112 predetermined portion
212 second seal arrangement portion
213 both end portions
23 terminal
231 resin portion
24 attachment surface
241 protrusion
25 opposing surface
31 upper surface
311 flat surface portion
3111 end portion
312 bent portion
3121 end portion
32 side surface
321 inclined portion
322 upper side
323 lower side
33 back surface
34 stopper
41 bottom surface
42 base-side seal arrangement portion
421 front surface side
422 side surface side
423 back surface side
43 attachment bracket
44 screw hole
61 one surface
62 other surface
611 through hole

The invention claimed is:

1. An electronic control unit comprising:
an electronic control board;
a connector provided on one end side of one surface of the electronic control board;
a cover provided on the one surface side and covering the electronic control board and the connector; and
a base provided on another surface side of the electronic control board so as to face the cover; and
a seal member interposed between the connector and the cover,
wherein the connector includes:
a connector main body;
a plurality of terminals arranged in a longitudinal direction of the connector main body and provided so as to protrude from the connector main body toward the one end side,
the connector main body includes:
an attachment surface attached to the electronic control board;
a seal arrangement portion which is positioned on a surface on a side facing the attachment surface and on which the seal member is disposed,
the seal arrangement portion includes:
a first seal arrangement portion formed in an arrangement direction of the terminals;
a second seal arrangement portion that is continuous with both end portions of the first seal arrangement portion and is inclined toward the electronic control board as it goes toward another end side facing the one end side of the electronic control board,
the first seal arrangement portion includes a plurality of predetermined portions formed so as to be directed toward the electronic control board side from a center side of the first seal arrangement portion toward both end sides of the first seal arrangement portion at both end portions of the first seal arrangement portion, the cover includes a plurality of bent portions formed so as to be directed toward the electronic control board side from a center side of the cover toward both end sides of the cover, and each of the predetermined portions is in contact with each of the bent portions, wherein the first seal arrangement portion includes a flat surface seal arrangement portion between the predetermined portions, and the seal member is disposed in the flat surface seal arrangement portion in the arrangement direction of the terminals, wherein the flat surface seal arrangement portion includes a flat surface-side groove portion in which the seal member is disposed, each of the predetermined portions includes:

a predetermined groove portion continuous with the flat surface-side groove portion; and an end-side groove portion continuous with the predetermined groove portion and the second seal arrangement portion, the predetermined groove portion is formed in a shape directed toward the electronic control board side from a center side of the first seal arrangement portion toward both end sides of the first seal arrangement portion, and the end-side groove portion is positioned closer to the electronic control board than the flat surface-side groove portion, wherein the predetermined portion further includes a predetermined bank portion formed by the predetermined groove portion, and the predetermined bank portion has an arc shape in which an inclination of a tangent of the predetermined bank portion in the arrangement direction of the terminals gradually changes from one end of the predetermined bank portion on a central side of the first seal arrangement portion toward another end of the predetermined bank portion on both end sides of the first seal arrangement portion.

2. The electronic control unit according to claim 1, wherein the second seal arrangement portion includes an inclined groove portion continuous with the end-side groove portion, a depth dimension of the inclined groove portion is formed to be longer than a depth dimension of the flat surface-side groove portion, the cover includes an inclined portion corresponding to the inclined groove portion, and the inclined portion is inserted into the seal member disposed in the inclined groove portion.

3. The electronic control unit according to claim 1, wherein the second seal arrangement portion includes a curved portion curved in the arrangement direction of the terminals.

4. The electronic control unit according to claim 3, wherein the electronic control unit is attached to another device by a plurality of attachment portions, the attachment portions are provided at both ends of the base, and the curved portion is provided at a position of the second seal arrangement portion on another end side of the electronic control board with respect to the attachment portion provided on one end side of the electronic control board.

5. The electronic control unit according to claim 4, wherein the attachment portion is provided in a predetermined region of the base, and the predetermined region is a region where the connector is provided at both ends of the base.

6. The electronic control unit according to claim 1, wherein the cover is attached to the base by a plurality of fastening portions, and each of the fastening portions is provided at a position of the cover on another end side of the electronic control board with respect to the connector main body.

7. The electronic control unit according to claim 1, wherein the predetermined portion further includes a predetermined bank portion formed by the predetermined groove portion, and the predetermined bank portion has a slope shape directed toward the electronic control board side at a constant angle from a center side of the first seal arrangement portion toward both ends of the first seal arrangement portion.

8. The electronic control unit according to claim 7, wherein the predetermined bank portion has at least one of an arc shape and the slope shape in which an inclination of a tangent of the predetermined bank portion in the arrangement direction of the terminals gradually changes from one end of the predetermined bank portion on a central side of the first seal arrangement portion toward another end of the predetermined bank portion at both ends of the first seal arrangement portion, and the predetermined groove portion is a combination of at least two or more of a slope shape directed toward the electronic control board at a constant angle from the center side of the first seal arrangement portion toward both ends of the first seal arrangement portion, a step shape directed from both ends of the flat surface-side groove portion toward the end-side groove portion in a lateral direction of the connector main body portion, and an arc shape in which an inclination of a tangent line of the predetermined bank portion in an arrangement direction of the terminals gradually changes from one end of the predetermined bank portion on the center side of the first seal arrangement portion toward the other end of the predetermined bank portion at both ends of the first seal arrangement portion.

9. The electronic control unit according to claim 1, wherein a depth dimension of the end-side groove portion is formed to be longer than a depth dimension of the flat surface-side groove portion, and wherein the predetermined groove portion is formed in a stepped shape from both ends of the flat surface-side groove portion toward the end-side groove portion in a lateral direction of the connector main body.

10. The electronic control unit according to claim 1, wherein the seal member has an adhesive function, and the connector and the cover are bonded by the seal member.

11. The electronic control unit according to claim 1, wherein the cover is made of resin.

12. The electronic control unit according to claim 1, wherein the cover is made of metal.

* * * * *